United States Patent [19]

Westerberg et al.

[11] 4,419,182
[45] Dec. 6, 1983

[54] METHOD OF FABRICATING SCREEN LENS ARRAY PLATES

[75] Inventors: Eugene R. Westerberg, Palo Alto, Calif.

[73] Assignee: Veeco Instruments Inc., Melville, N.Y.

[21] Appl. No.: 239,066

[22] Filed: Feb. 27, 1981

[51] Int. Cl.³ .............. H01L 21/306; B44C 1/22; C03C 15/00; C03C 25/06
[52] U.S. Cl. .................. 156/644; 156/628; 156/647; 156/657; 156/662
[58] Field of Search ............ 148/1.5, 187; 313/402, 313/403, 408, 461, 473, 415; 250/396 ML, 492 A; 315/382, 391; 428/134, 135, 137; 430/5; 156/628, 644, 647, 657, 659.1, 661.1, 662, 653

[56] References Cited

U.S. PATENT DOCUMENTS

| 3,899,711 | 8/1975 | Lemmond | 313/458 |
| 3,962,052 | 6/1976 | Abbas et al. | 204/129.65 X |
| 4,021,276 | 5/1977 | Cho et al. | 156/644 |
| 4,200,794 | 4/1980 | Newberry | 250/396 ML |

Primary Examiner—William A. Powell
Attorney, Agent, or Firm—Morgan, Finnegan, Pine, Foley & Lee

[57] ABSTRACT

A method of fabricating lens and aperture array plates in silicon using photo or electron beam lithographic patterning followed by indiffusion of boron and anisotropic silicon etching and assembling to form screen lenses is disclosed.

4 Claims, 3 Drawing Figures

SINGLE PLATE SCREEN LENS DETAIL

SCREEN LENS ARRAY

TWO PLATE SCREEN LENS DETAIL

SINGLE PLATE SCREEN LENS DETAIL

METHOD OF FABRICATING SCREEN LENS ARRAY PLATES

BACKGROUND OF THE INVENTION

This invention relates to the field of charged particle beam lithography systems, and more particularly to a method for fabricating a lens array for use with a multiple charged particle beam exposure system.

As integrated circuits become more complex there is a general trend in the semiconductor industry toward increasing device packaging density. In this way the number of circuit elements per die can be increased, or the die size can be reduced. The present philosophy is to make chip or die sizes as small as possible, as this increases the device yield. However, it is obvious that chip size cannot be arbitrarily reduced because of the inherent resolution limits of presently used photolithographic processes. In particular, the wavelength of light imposes a barrier to the reproduction of detail in the region of one $\mu$m(micrometer).

a number of solutions have been proposed to solve the resolution problem and there is considerable activity in this area presently underway in the semiconductor industry. These solutions are based on lithographic techniques that employ particles of shorter wavelengths than visible light to overcome the resolution limitation. Generally, two classes of short wavelength particles have been proposed as alternatives to light, i.e., high energy photons (x-rays) and electrons.

An optimal lithographic system would have to possess certain attributes in order for it to be a serious contender for use in the production of integrated circuits. These attributes include resolution, coverage, lithographic speed, reregistration capability and stability.

At present, minimum reproducible line widths on the order of 1 $\mu$m are in use, and future integrated circuit structures will probably push the desired system resolution requirements to below $\frac{1}{4}$ $\mu$m. The exposure system should be capable of covering the standard 75 mm and/or 100 mm wafers presently used in industry and be expandable to cover the larger sized wafers (125–150 mm) being contemplated. Clearly wafer exposure times measured in tens of minutes to hours are not acceptable in production exposure systems. Acceptable throughput conditions demand full 75 mm and/or 100 mm wafer exposure times of at most a few minutes.

A parallel charged particle beam system is described in a commonly assigned copending application of Eugene R. Westerberg and Ivor Brodie, Ser. No. 227,620, filed Jan. 23, 1981, the disclosure of which is incorporated herein by reference. In this system, the throughput capability of conventional types of lithography systems is increased significantly by utilizing a multiple charged particle beam exposure system for directly writing an integrated circuit pattern simultaneously at a plurality of locations on a target surface. In one embodiment of the disclosed system, an electron source produces an electron beam which is used to illuminate an object aperture. A screen lens consisting of a multiplicity of holes breaks up the flood electron beam emanating from the object aperture into a multiplicity of beams and focuses them in parallel on a resist-coated substrate. Each hole in the lens plate acts as a small aperture lens when a positive potential is applied to the wafer with respect to the screen lens.

An optimal screen lens array fabrication method would have to be capable of producing coaxial beam limiting apertures and aperture lenses in arrays having certain performance requirements for it to be a serious contender for use in the production of screen lens arrays. In particular, the resulting screen lens arrays should be comprised of two thin plates of conducting material with arrays of holes concentric to better than 25 $\mu$m in both planes. Each upper hole or "aperture" should have a diameter in the range of 0.25 to 1.0 mm, and each lower hole or "lens" should have a diameter of 1.0 to 2.0 mm. The spacing between the two planes containing these holes should lie in the range 1.0 to 3.0 mm. The hole diameters given above should be accurate to $\pm 25$ $\mu$m (lens plate-to-lens plate) and to $\pm 12$ $\mu$m within a given plate. Also, the deviation in the diameter of any hole due to ellipticity must be less than 2 $\mu$m. Edge burrs should be avoided; but, when present, should not exceed 2 $\mu$m if burr projects towards the lens axis and 5 $\mu$m when projecting away from the lens axis.

In some applications, the lenses may be constructed from a solid piece of material to simulate the aperture and lens holes.

For standard 100 mm wafers the lens plate should be 100 mm or larger in diameter and contain a minimum of 50 lenslets and a maximum of 1,000 lenslets arranged on a cartesian grid. The spacing between nearest neighbors should be accurate to $\pm 25$ $\mu$m. The aperature plate and the lens plate should be coplanar to within $\pm 12$ $\mu$.

Fabrication methods for making screen lens arrays are known in the art. However, the known methods suffer from one or more limitations or drawbacks which preclude their application for making screen lens arrays of the type utilized in the aforementioned patent application of Westerberg and Brodie. For example, although the prior art discloses the utilization of Boron indiffusion techniques, they do not provide satisfactory solutions to the problems which applicants' invention addresses. In particular, the known "spin coating" technique for application of the Boron does not provide a satisfactory screen lens array having the aforementioned performance characteristics. Moreover, the disclosed Boron penetration depths (on the order of 2 $\mu$m) do not provide sufficient mechanical strength. And finally, the teachings of the prior art are silent as to what constitutes a workable Boron atom concentration.

It is accordingly a general object of the present invention to overcome the aforementioned limitations and drawbacks associated with known methods and to fulfill the needs mentioned by providing a method for fabricating screen lens arrays for use in a charged particle beam exposure system having all of the desirable attributes noted above.

It is a particular object of the invention to provide fabrication methods for producing high resolution screen lens arrays.

Other objects will be apparent in the following detailed description and the practice of the invention.

BRIEF DESCRIPTION OF THE DRAWINGS

Serving to illustrate the preferred embodiment of the invention are the FIGS. 1–3 which depict an individual screen lens array consisting of an aperture plate and a lens plate.

SUMMARY OF THE INVENTION

The foregoing and other objects and advantages which will be apparent in the following detailed description of the preferred embodiment, or in the practice of the invention, are achieved by the invention disclosed herein, which generally may be characterized as a method of fabricating screen lens array plates, from round, polished silicon wafers of about 0.5 mm thickness comprising the steps of: polishing both sides of a silicon wafer; oxidizing both sides of the silicon wafer to produce a high density, low porosity oxide coating having a thickness of about 2 $\mu$m; exposing by photo or electron beam lithographic techniques a predetermined pattern on both sides of the silicon wafer; indiffusing a boron layer into both sides of the wafer to a depth of about 10 $\mu$m to a concentration greater than about $7 \times 10^{19}$ atoms/cm$^3$; and anisotropically etching the silicon wafer until said predetermined pattern has been formed through the thickness of the wafer.

DETAILED DESCRIPTION OF THE PREFERRED EMBODIMENT

Figure 1:
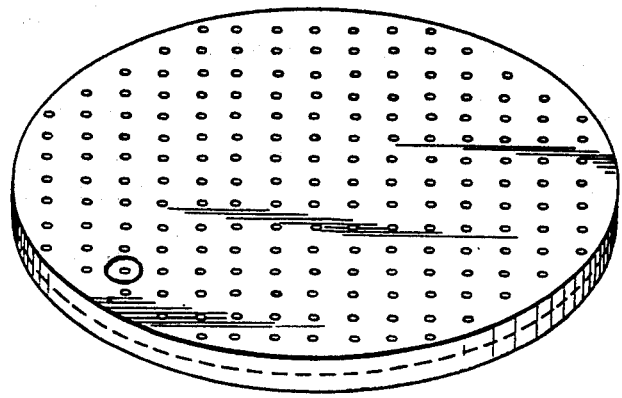

A procedure has been established for fabricating lens and aperture plates that can be assembled into a high performance array of electron lenses referred to as a "screen-lens." shown in FIG. 1 The screen-lens forms an important part of a parallel writing electron beam exposure system such as that described in the aforementioned application of Westerberg and Brodie. More specifically, it offers a significant reduction in the time required for patterning electron sensitive resists at submicron resolutions.

Figure 2:
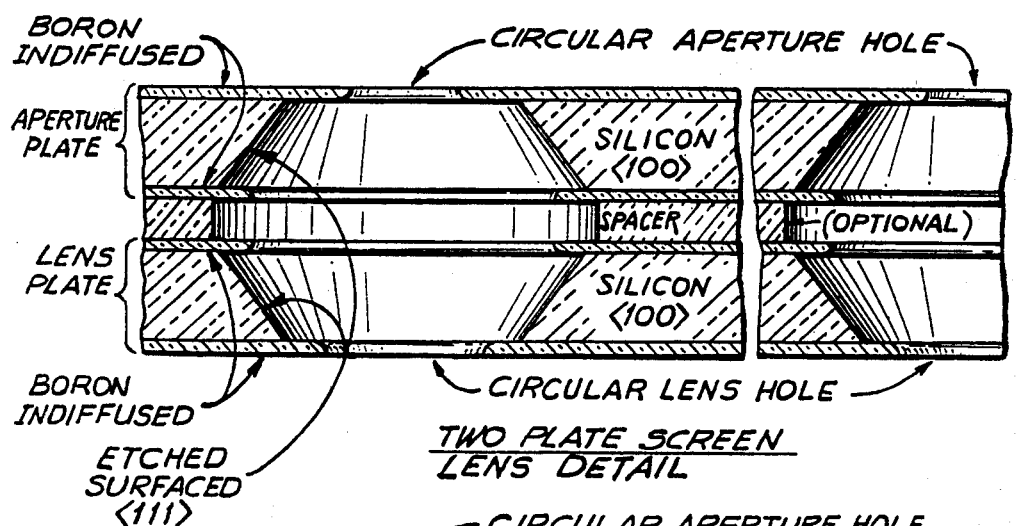

In accordance with the present invention, aperture and lens plates are fabricated in silicon using photo or electron beam lithographic patterning followed by indiffusion of boron and anisotropic silicon etching. Plates are used in pairs spaced apart and parallel from one another and with their hole arrays mutually aligned to within $\pm 25$ $\mu$m to make a full screen lens. As illustrated in more detail in FIG. 2 one plate is designated the "aperture" plate and the other the "lens" plate. The former consists of an array of holes (typically $-0.5$ to 0.75 mm diameter) etched through a single crystal $<100>$ silicon wafer that is 100 mm in diameter. The latter is a similar silicon wafer with larger holes (typically 1.5 mm diameter).

Theoretical studies indicate, and we have verified experimentally, that in order to provide very high resolution lithography ($<0.25$ $\mu$m) feature size the plates must be very flat (deviation of less than 12 $\mu$m across the wafer), the holes very round (less than 1 $\mu$m ellipticity) and the side walls very smooth ($<0.25$ $\mu$m).

Single crystal, 100 $\mu$m diameter silicon wafers with a $<100>$ orientation and having a thickness of about 0.5 mm are used as starting structures for lens plates. One surface of each wafer (top) is polished with a flatness deviation of less than 12 $\mu$m and the other surface (bottom) is polished flat to better than 50 $\mu$m. Either p- or n-type wafers can be used, provided the resistivities are 0.1 ohm cm or greater. The wafers are cleaned using standard semiconductor cleaning techniques and then both sides are oxidized to produce a high density, low porosity oxide coating of $2.0 \pm 0.3$ $\mu$m.

Patterns are then exposed on both sides of the wafer with photolithography using negative resist and high quality chrome masks. The resist is a standard KTI resist with 70° C., $\frac{1}{2}$ hour prebake, and 150° C. $\frac{1}{2}$ hour post bake. Since both sides of the wafer are to be exposed the masks for top and bottom are pre-aligned so that opposite holes are concentric to within $\pm 25$ $\mu$m. Larger deviations than this will produce noticeable astigmatism in the high resolution images.

Higher resolution patterns can be produced using a negative electron-sensitive resist and exposing the resist with electrons through a master plate with holes at the correct spacings.

After development and post bake the exposed oxide is etched to a bare silicon in a buffered oxide etch leaving circular islands as masks for the next major step of boron indiffusion. The resist is removed and boron glass is deposited for 3 hours at 1200° C. from a gaseous mixture (diborane and oxygen are typical component gases). The deposited glass is removed in HF and the wafer reheated in $0_2$ for 1 hour at 1200° C. followed by a further boron drive-in in $N_2$ for 4 more hours. At the end of this step the boron layer has been indiffused into both sides of the wafer to a depth of about 10 $\mu$m with a concentration greater than $7 \times 10^{19}$ boron atoms/cm$^3$.

The top side is protected with a mask such as "Krylon" plastic and the oxide removed from the bottom in buffered oxide etch. The plastic layer is then removed (toluene) cleaned in isopropyl alcohol and blown dry with warm $N_2$.

The lens bottom hole structure can now be etched to completion in a mixture of pyrocatechol ethylene-diamine and water (1 g pyrocatechol to each 5.6 cc of ethylene-diamine and 2.2 cc of $H_2O$). Etching is carried out at 110° C. to completion (8–16 hours) in a condensing system under a nitrogen atmosphere. This anisotropic etch selectively removes silicon in orientations other than the $<111>$ direction and etching effectively stops when only $<111>$ planes remain. The completed silicon-etched wafers are removed, placed in 90° C. $H_2O$ to remove residues, flushed with isopropyl alcohol and dried in warm $N_2$.

Finally, the remaining oxide is removed in buffered oxide etch and the entire lens carefully cleaned in isopropyl alcohol followed by a warm $N_2$ drying.

As indicated above, the preferred embodiment is to form the screen lens of one each aperture and lens plates, mounted back-to-back, i.e., with the larger openings together. This assembly can be done by adhering the faces of the two plates directly together, maintaining the specified hole alignment and outer face planarity, or with a spacer plate with oversized holes intermediate to the aperture and lens plates, to provide a desired aperture-to-lens spacing independent of the thickness of the lens and aperture plates.

Figure 3:
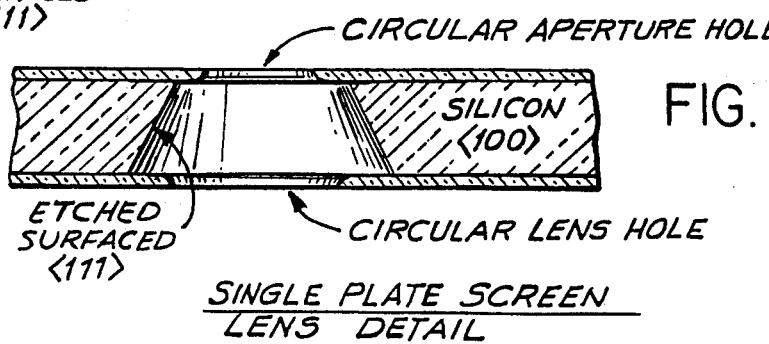

As shown in FIG. 3, it is also possible to use a single lens (or aperture) plate as a screen lens with lower eletron optical resolution than the two plate configuration. The smaller holes are used as apertures and the larger holes as the lens elements. (In this case, the lens hole diameters would not be the approximately 1.5 mm diameter, but more like 0.75 mm.)

Accordingly, it is clear that the above description of the preferred embodiment in no way limits the scope of the present invention which is defined by the following claims.

What is claimed is:

1. A method of fabricating screen lens array plates from round, silicon wafers of about 0.5 mm thickness comprising the steps of:

(a) polishing both sides of a silicon wafer;
(b) oxidizing both sides of the silicon wafer to produce a high density, low porosity oxide coating having a thickness of about 2 microns;

(c) exposing by photolithographic techniques a predetermined pattern on both sides of the silicon wafer;
(d) indiffusing in conjunction with vapor transfer techniques a boron layer into both sides of the wafer to a depth of about 10 microns to a concentration greater than about $7 \times 10^{19}$ atoms/cm$^3$; and
(e) anisotropically etching the silicon wafer until said predetermined pattern has been formed through the thickness of the wafer.

2. A method of fabricating screen lens array plates from round, silicon wafers of about 0.5 mm thickness comprising the steps of:
(a) polishing both sides of a silicon wafer;
(b) oxidizing both sides of the silicon wafer to produce a high density, low porosity oxide coating having a thickness of about 2 microns;
(c) exposing by electron beam lithographic techniques a predetermined pattern on both sides of the silicon wafer;
(d) indiffusing in conjunction with vapor transfer techniques a boron layer into both sides of the wafer to a depth of about 10 microns to a concentration greather than about $7 \times 10^{19}$ atoms/cm$^3$; and
(e) anisotropically etching the silicon wafer until said predetermined pattern has been formed through the thickness of the wafer.

3. A method of fabricating screen lens array plates from round, silicon wafers of about 0.5 mm thickness comprising the steps of:
(a) polishing both sides of a silicon wafer;
(b) oxidizing both sides of the silicon wafer to produce a high density, low porosity oxide coating having a thickness of about 2 microns;
(c) applying a thin, uniform layer of negative resist to both sides of the silicon wafer;
(d) exposing by photolithographic techniques a predetermined pattern on both sides of the silicon wafer;
(e) developing the resulting resist pattern;
(f) etching away the exposed oxide;
(g) removing the remaining photoresist;
(h) depositing boron for about 3 hours at about 1200° C. on each of the wafer/oxide surfaces;
(i) indiffusing in conjunction with vapor transfer techniques the boron layer into both sides of the wafer to a depth of about 10 microns at a concentration greater than about $7 \times 10^{19}$ atoms/cm$^3$ in the areas not protected by the remaining oxide;
(j) etching away the remaining oxide; and
(k) anistropically etching the silicon wafer until said predetermined pattern has been formed through the thickness of the wafer.

4. A method of fabricating screen lens array plates from round, silicon wafers of about 0.5 mm thickness comprising the steps of:
(a) polishing both sides of a silicon wafer;
(b) oxidizing both sides of the silicon wafer to produce a high density, low porosity oxide coating having a thickness of about 2 microns;
(c) applying a thin, uniform layer of negative resist to both sides of the silicon wafer;
(d) exposing by electron beam lithographic techniques a predetermined pattern on both sides of the silicon wafer;
(e) developing the resulting resist pattern;
(f) etching away the exposed oxide;
(g) removing the remaining photoresist;
(h) depositing boron for about 3 hours at about 1200° C. on each of the wafer/oxide surfaces;
(i) indiffusing in conjunction with vapor transfer techniques the boron layer into both sides of the wafer to a depth of about 10 microns at a concentration greater than about $7 \times 10^{19}$ atoms/cm$^3$ in the areas not protected by the remaining oxide;
(j) etching away the remaining oxide; and
(k) anisotropically etching the silicon wafer until said predetermined pattern has been formed through the thickness of the wafer.

* * * * *

UNITED STATES PATENT AND TRADEMARK OFFICE
CERTIFICATE OF CORRECTION

PATENT NO. : 4,419,182

DATED : Dec. 6, 1983

INVENTOR(S) : Eugene R. Westerberg

It is certified that error appears in the above—identified patent and that said Letters Patent is hereby corrected as shown below:

On the title page, "Westerberg et al" should read -- Westerberg --; item 75, "inventors" should read -- inventor --.

In column 5, line 22, "greather" should read -- greater --.

Signed and Sealed this

Thirty-first Day of July 1984

[SEAL]

Attest:

GERALD J. MOSSINGHOFF

Attesting Officer    Commissioner of Patents and Trademarks